US012641751B2

(12) United States Patent
Bauduin et al.

(10) Patent No.: US 12,641,751 B2
(45) Date of Patent: May 26, 2026

(54) COOLING BLOCK FOR COOLING A HEAT-GENERATING ELECTRONIC COMPONENT AND METHOD FOR MANUFACTURING THEREOF

(71) Applicant: OVH, Roubaix (FR)

(72) Inventors: Hadrien Bauduin, Villeneuve d'Ascq (FR); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 18/236,593

(22) Filed: Aug. 22, 2023

(65) Prior Publication Data

US 2024/0074098 A1     Feb. 29, 2024

(30) Foreign Application Priority Data

Aug. 30, 2022     (EP) ..................................... 22306285

(51) Int. Cl.
| | |
|---|---|
| *H05K 7/20* | (2006.01) |
| *B23C 3/34* | (2006.01) |
| *F28F 3/12* | (2006.01) |

(52) U.S. Cl.
CPC ........... *H05K 7/20254* (2013.01); *B23C 3/34* (2013.01); *F28F 3/12* (2013.01); *B23C 2220/363* (2013.01)

(58) Field of Classification Search
CPC .................. H05K 7/20254; B23C 3/34; B23C 2220/363; F28F 3/12
See application file for complete search history.

(56) References Cited

U.S. PATENT DOCUMENTS

| | | | | |
|---|---|---|---|---|
| 490,506 A | * | 1/1893 | Seitz .......................... | F28F 3/12 |
| | | | | 165/170 |
| 5,514,906 A | | 5/1996 | Love et al. | |
| 5,544,703 A | | 8/1996 | Ricard et al. | |

(Continued)

FOREIGN PATENT DOCUMENTS

| | | |
|---|---|---|
| CN | 104465562 B | 11/2017 |
| CN | 112408310 A | 2/2021 |

(Continued)

OTHER PUBLICATIONS

European Search Report with regard to the EP Patent Application No. 22306277.9 completed Feb. 10, 2023.

(Continued)

*Primary Examiner* — Tho V Duong

(74) *Attorney, Agent, or Firm* — BCF LLP

(57) ABSTRACT

A cooling block includes a body having a thermal transfer surface configured to be in thermal contact with a heat-generating electronic component. The body defines a fluid conduit having a plurality of channels such that the cooling fluid flows in parallel along the channels. Each channel is defined between first and second internal sidewalls; and top and bottom walls. Each channel has either: a first dimensional configuration including first height and width values; or a second dimensional configuration including second height and width values. The first height value is greater than the second height value. The second width value is greater (Continued)

than the first width value. A thickness of a material of the body between the thermal transfer surface and a first channel is less than a thickness of the material of the body between the thermal transfer surface and a second channel.

12 Claims, 8 Drawing Sheets

(56)                References Cited

U.S. PATENT DOCUMENTS

| | | | |
|---|---|---|---|
| 5,660,230 | A | 8/1997 | Obosu et al. |
| 6,994,151 | B2 | 2/2006 | Zhou et al. |
| 7,035,104 | B2 | 4/2006 | Meyer |
| 7,215,545 | B1 * | 5/2007 | Moghaddam ....... H01L 23/3732 |
| | | | 361/708 |
| 7,990,711 | B1 | 8/2011 | Andry et al. |
| 9,844,165 | B2 | 12/2017 | Sever |
| 12,215,933 | B2 | 2/2025 | Catuneanu et al. |
| 2001/0004370 | A1 | 6/2001 | Miyajima et al. |
| 2003/0071525 | A1 | 4/2003 | Tong et al. |
| 2007/0227697 | A1 * | 10/2007 | Takahashi ............ H01L 23/473 |
| | | | 257/E23.098 |
| 2008/0066888 | A1 | 3/2008 | Tong et al. |
| 2009/0114372 | A1 | 5/2009 | Ippoushi et al. |
| 2011/0056669 | A1 | 3/2011 | Pruett et al. |
| 2011/0315367 | A1 * | 12/2011 | Romero .................. F28F 3/022 |
| | | | 165/185 |
| 2014/0091453 | A1 | 4/2014 | Mori et al. |
| 2014/0138063 | A1 | 5/2014 | Kawaura et al. |
| 2018/0100710 | A1 | 4/2018 | Chainer et al. |
| 2020/0072565 | A1 | 3/2020 | Klaba et al. |
| 2024/0049429 | A1 | 2/2024 | Li et al. |
| 2024/0098935 | A1 | 3/2024 | Schultz |
| 2024/0324152 | A1 | 9/2024 | Hart et al. |

FOREIGN PATENT DOCUMENTS

| | | | |
|---|---|---|---|
| CN | 214829018 U | 11/2021 | |
| DE | 102011118483 A1 | 5/2013 | |
| EP | 2772717 A1 | 9/2014 | |
| EP | 2879162 A1 | 6/2015 | |
| EP | 3620741 A1 | 3/2020 | |
| FR | 3047549 A1 * | 8/2017 | .............. F24H 1/43 |
| JP | 2008039100 A * | 2/2008 | .............. F28F 3/12 |
| WO | 2005/015106 A1 | 2/2005 | |
| WO | WO-2012005305 A1 * | 1/2012 | ............ C23C 24/04 |

OTHER PUBLICATIONS

English Abstract for CN 104465562 retrieved on Espacenet on Aug. 22, 2023.

English Abstract for DE 102011118483 retrieved on Espacenet on Aug. 22, 2023.

European Search Report with regard to the EP Patent Application No. 22306285.2 completed Feb. 1, 2023.

European Search Report with regard to the EP Patent Application No. 22306278.7 completed Jan. 31, 2023.

Certificate of Correction for U.S. Pat. No. 5,514,906.

English Abstract for CN112408310 retrieved on Espacenet on Aug. 22, 2023.

Office Action with regard to the counterpart U.S. Appl. No. 18/236,559 issued Sep. 11, 2025.

Office Action with regard to the counterpart U.S. Appl. No. 18/236,610 mailed Dec. 19, 2025.

* cited by examiner

COOLING BLOCK FOR COOLING A HEAT-GENERATING ELECTRONIC COMPONENT AND METHOD FOR MANUFACTURING THEREOF

CROSS REFERENCE

The present application claims priority to EP Application No. 22306285.2, filed Aug. 30, 2022 entitled "Cooling Block for Cooling a Heat-Generating Electronic Component and Method for Manufacturing Thereof", the entirety of which is incorporated herein by reference.

FIELD OF TECHNOLOGY

The present technology relates to cooling blocks and methods for manufacturing thereof.

BACKGROUND

Heat dissipation is an important consideration for computer systems. Notably, many components of a computer system, such as a processor (also referred to as central processing unit (CPU)), generate heat and thus require cooling to avoid performance degradation and, in some cases, failure. Similar considerations arise for systems other than computer systems (e.g., power management systems). Thus, in many cases, different types of cooling solutions are implemented to promote heat dissipation from heat-generating electronic components, with the objective being to collect and conduct thermal energy away from these heat-generating electronic components. For instance, in a data center, in which multiple electronic systems (e.g., servers, networking equipment, power equipment) are continuously operating and generating heat, such cooling solutions may be particularly important.

One example of a cooling solution is a heat sink which relies on a heat transfer medium (e.g., a gas or liquid) to carry away the heat generated by a heat-generating electronic component. For instance, a cooling block (sometimes referred to as a "water block" or "cold plate") can be thermally coupled to a heat-generating electronic component and water (or other fluid) is made to flow through a conduit in the cooling block to absorb heat from the heat-generating electronic component. As water flows out of the cooling block, so does the thermal energy collected thereby. However, in many cases, efficient cooling blocks may be difficult and/or expensive to manufacture.

There is therefore a desire for a cooling block which can alleviate at least some of these drawbacks.

SUMMARY

It is an object of the present technology to ameliorate at least some of the inconveniences present in the prior art.

According to one aspect of the present technology, there is provided a cooling block for cooling a heat-generating electronic component. The cooling block comprises a body having a thermal transfer surface on a lower side thereof configured to be in thermal contact with the heat-generating electronic component, the body defining a fluid conduit for circulating a cooling fluid therethrough, the fluid conduit having an inlet and an outlet for receiving and discharging the cooling fluid respectively; the fluid conduit having a plurality of channels extending from a first point to a second point along the fluid conduit such that, in use, the cooling fluid flows in parallel along the channels from the first point to the second point, each channel of the plurality of channels being defined between: first and second internal sidewalls defining a width of the channel therebetween; and top and bottom walls extending between the first and second internal sidewalls, a height of the channel being defined between the top and bottom walls, the bottom wall being closer to the thermal transfer surface in a height direction of the cooling block than the top wall, wherein: each channel of the plurality of channels is dimensioned to have either: a first dimensional configuration whereby the height of the channel has a first height value and the width of the channel has a first width value; or a second dimensional configuration whereby the height of the channel has a second height value and the width of the channel has a second width value, the first height value being greater than the second height value, the second width value being greater than the first width value; the plurality of channels includes at least one first channel having the first dimensional configuration and at least one second channel having the second dimensional configuration; and a thickness of a material of the body between the thermal transfer surface and any part of the at least one first channel is less than a thickness of the material of the body between the thermal transfer surface and any part of the at least one second channel.

In some embodiments, each channel of the plurality of channels has a common cross-sectional area that is a product of the height and the width thereof.

In some embodiments, the first height value is equal to the second width value; and the second height value is equal to the first width value.

In some embodiments, the first height value and the second width value are between 2 and 5 mm inclusively; and the second height value and the first width value are between 1 and 3 mm inclusively.

In some embodiments, the first height value and the second width value are approximately 3 mm.

In some embodiments, the second height value and the first width value are approximately 1.5 mm.

In some embodiments, the at least one first channel includes two first channels.

In some embodiments, the least one second channel includes two second channels.

In some embodiments, the first point corresponds to the inlet of the fluid conduit and the second point corresponds to the outlet of the fluid conduit.

In some embodiments, the body of the cooling block comprises a base and a cover connected to the base, the base comprising the thermal transfer surface; and a path of the fluid conduit is defined by the base of the cooling block.

In some embodiments, the cover is a planar plate member; and the top wall defining each channel of the plurality of channels is defined by a lower surface of the cover.

In some embodiments, a path described by the fluid conduit is generally spiral.

According to another aspect of the present technology, there is provided a method for manufacturing a cooling block configured to cool a heat-generating electronic component, the method comprising: providing a base for forming part of the cooling block, the base having a thermal transfer surface configured to be placed in thermal contact with the heat-generating electronic component; milling a first channel on an upper surface of the base such that the first channel has a first dimensional configuration whereby a height of the first channel has a first height value and a width of the first channel has a first width value; milling a second channel on the upper surface of the base such that the second channel has a second dimensional configuration whereby a height of the second channel has a second height value and a width of the second channel has a second width value, the height of each of the first and second channels being measured from the upper surface of the base, the first height value being greater than the second height value, the second width value being greater than the first width value, each of the first and second channels having a common cross-sectional area that is a product of the height and the width thereof.

In some embodiments, the first height value is equal to the second width value; the second height value is equal to the first width value; milling the first channel comprises: performing a first cutting operation to remove material from the base with a milling cutter along a first path, the milling cutter removing material from the base at a first depth from the upper surface during the first cutting portion, the first depth being equal to or less than a diameter of the milling cutter, the diameter of the milling cutter corresponding to the width of the first channel; and after performing the first cutting operation, performing a second cutting operation to remove material along the first path with the miller cutter at a second depth from the upper surface, the second depth being greater than the first depth; and milling the second channel comprises: performing a third cutting operation to remove material from the base with the milling cutter along a second path; and performing a fourth cutting operation to remove material from the base with the milling cutter along a third path parallel to the second path, during the third and fourth cutting operations, the milling cutter removing material from the base at a second depth from the upper surface, the second depth corresponding to the second height value, the diameter of the milling cutter corresponding to the height of the second channel.

In some embodiments, the milling cutter has a diameter between 1 and 3 mm.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

It is to be understood that terms relating to the position and/or orientation of components such as "upper", "lower", "top", "bottom", "front", "rear", "left", "right", "longitudinal", "lateral", "vertical", etc. are used herein to simplify the description and are not intended to be limitative of the particular position/orientation of the components in use.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
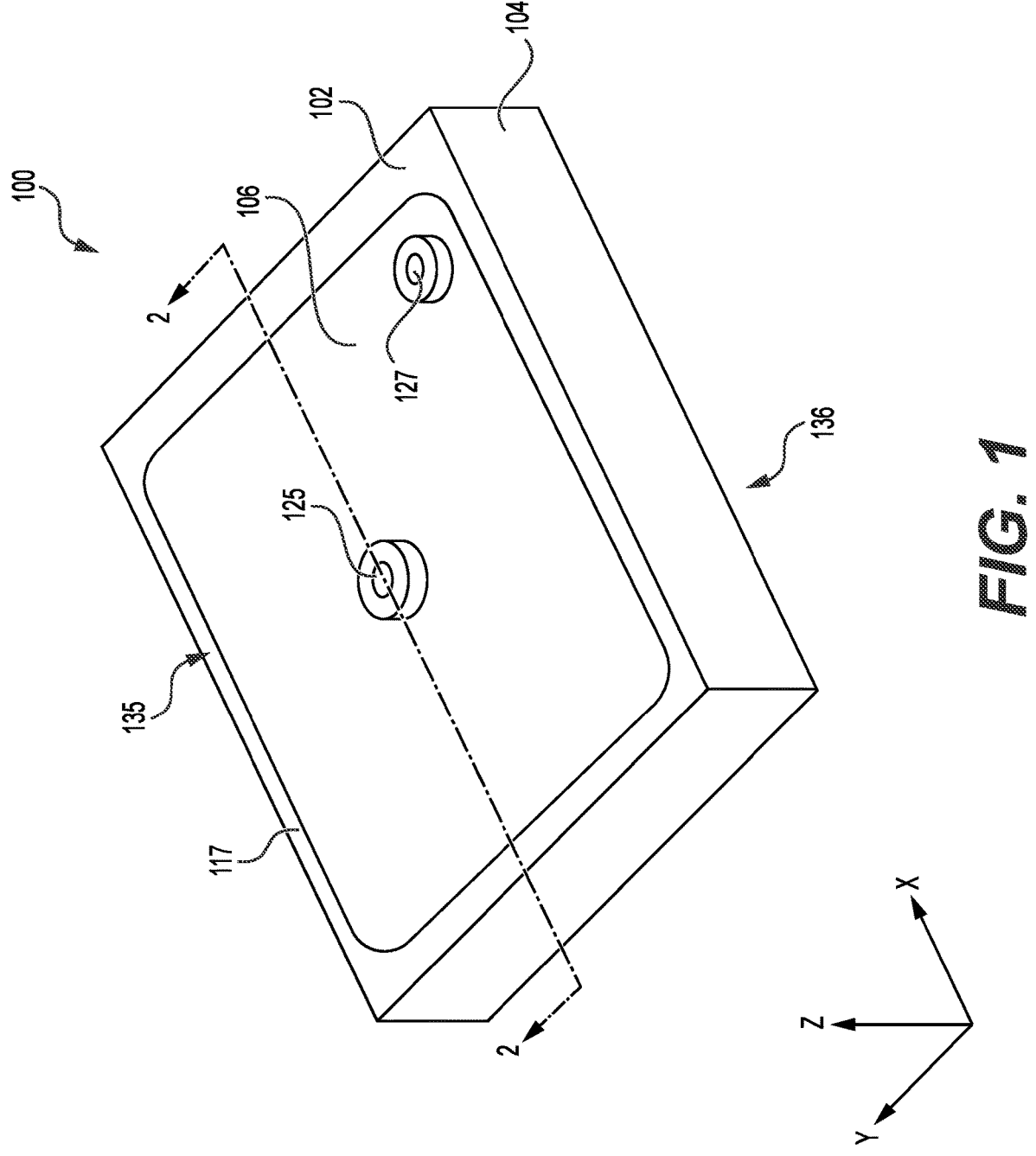
FIG. 1 is a perspective view, taken from a top, front, left side, of a cooling block according to an embodiment of the present technology.
Figure 2:
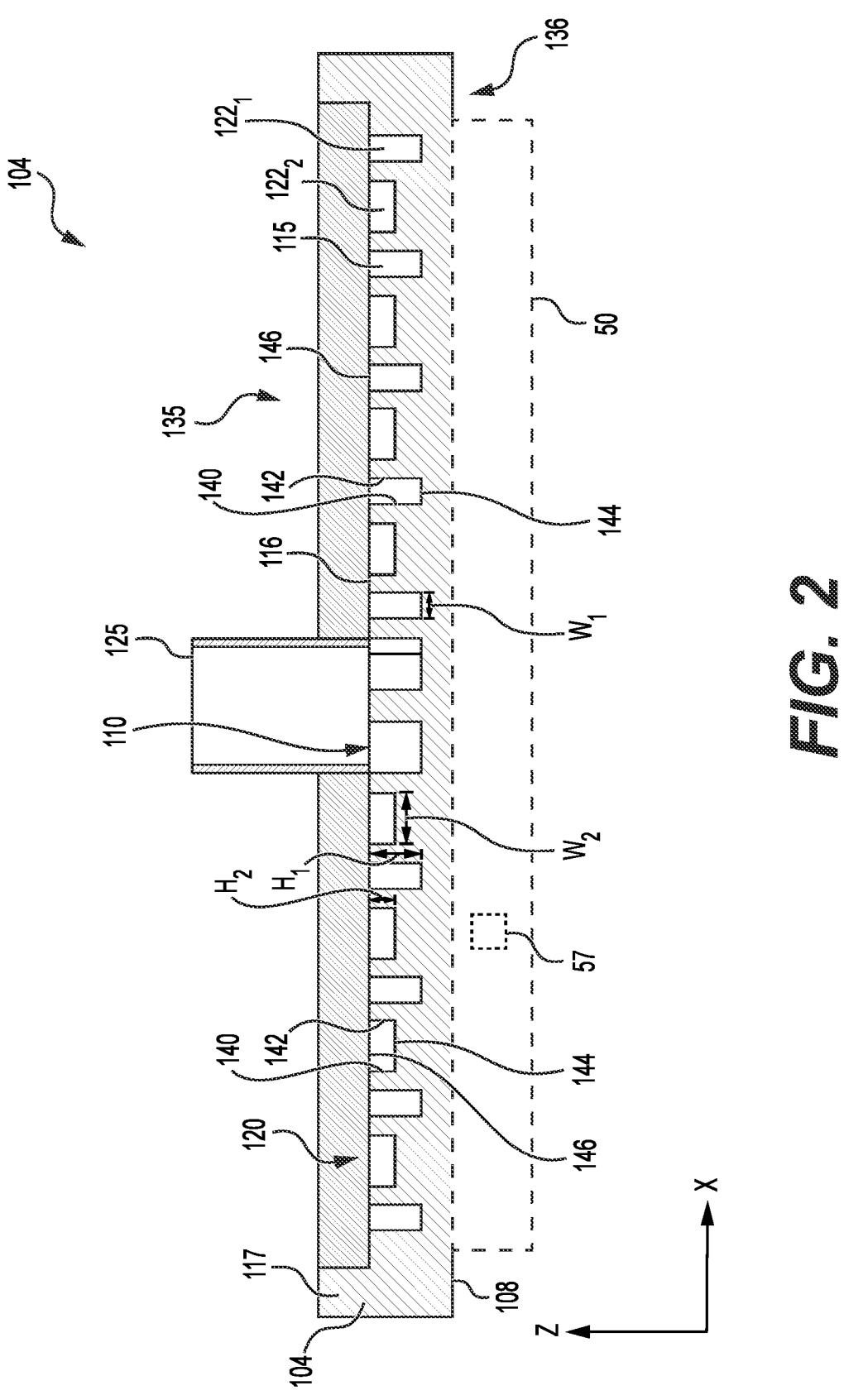
FIG. 2 is a cross-sectional view of the cooling block of FIG. 1 taken along line 2-2 in FIG. 1.

FIGS. 1 and 2 illustrate a cooling block 100 in accordance with an embodiment of the present technology. The cooling block 100 is configured for cooling a heat-generating electronic component 50 (illustrated schematically in FIG. 2). In this example, the heat-generating electronic components 50 is a central processing unit (CPU). For instance, the heat-generating electronic component 50 may be part of a server operating within a data center. In use, the heat-generating electronic component 50 generates a significant amount of heat and can therefore benefit from cooling. It is contemplated that the heat-generating electronic component 50 could be any other suitable heat-generating electronic component (e.g., a graphics processing unit (GPU), a semiconductor, a memory unit, etc.).

The cooling block 100 will now be described with reference to FIGS. 1 to 3. The cooling block 100 has a body 102 including a base 104 and a cover 106 which are connected to each other. For instance, in this example, the cover 106 is welded to the base 104 (e.g., via laser welding). The cover 106 may be fixed to the base 104 differently in other embodiments. As shown in FIG. 2, the base 104 includes a thermal transfer surface 108 disposed on a lower side of the base 104. The thermal transfer surface 108 is configured to be placed in thermal contact with the heat-generating electronic component 50. It is to be understood that the thermal transfer surface 108 can be in thermal contact with the heat-generating electronic component 50 whether the thermal transfer surface is in direct contact with the heat-generating electronic component 50 or a thermal interface material (e.g., a thermal paste, a thermal pad, a graphite sheet, etc.) is disposed therebetween with the express intention of improving the heat transfer between the heat-generating electronic component 50 and the cooling block 100.

As shown in FIG. 2, together, the base 104 and the cover 106 define an internal fluid conduit 115 within which a cooling fluid is circulated to absorb heat from the heat-generating electronic component 50. The internal fluid conduit 115 extends from an inlet 110 to an outlet 112. In this example, the inlet 110 is disposed generally centrally in longitudinal and lateral directions (i.e., along the Y-axis and X-axis respectively) of the cooling block 100, whereas the outlet 112 is disposed near a corner of the rectangular cooling block 100. The inlet 110 and the outlet 112 could be disposed at different locations in other embodiments. In this embodiment, the cooling fluid circulated through the internal fluid conduit 115 is demineralized water. However, the cooling fluid may be any other suitable cooling fluid (e.g., a refrigerant) in other embodiments. In some embodiments, the cooling fluid may be capable of two-phase flow such that the cooling fluid can change phases from liquid to gas and vice-versa based on a temperature thereof. The cooling fluid circulating within the cooling block 10 will thus, at some point, be in the liquid phase, however the cooling fluid may not necessarily be in liquid phase throughout (e.g., the cooling fluid may evaporate from liquid to gas when its temperature reaches a certain value).

Figure 3:
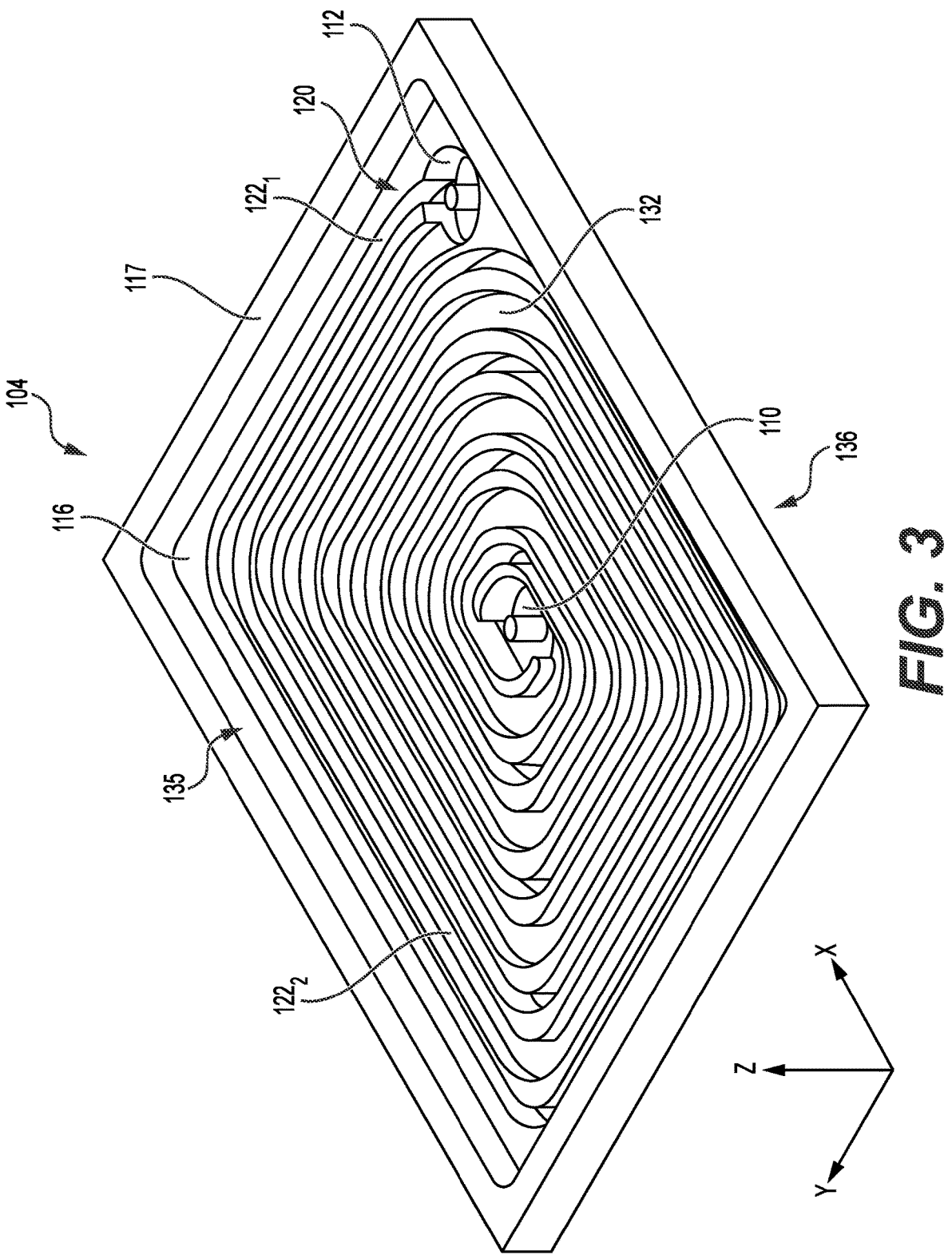
FIG. 3 is a perspective view, taken from a top, front, left side, of a base of the cooling block of FIG. 1.

With reference to FIGS. 2 and 3, in this embodiment, a path of the fluid conduit 115 is defined by the base 104. Notably, the base 104 defines a recess 132 that is machined, namely milled, into the upper surface 116 of the base 104. The recess 132 defines the trajectory of the cooling fluid as it flows from the inlet 110 to the outlet 112. The manner in which the recess 132 is milled will be described in greater detail further below.

As shown in FIG. 2, in this embodiment, the cover 106 is received in a pocket 120 defined by the base 104 such that a lower surface 114 of the cover 106 is in contact with an upper surface 116 of the base 104. The upper surface 116 and a rim portion 117 of the base 104 define the pocket 120 of the base 104 in which the cover 106 is received. The upper surface 116 is disposed on an upper side of the base 104 (i.e., on an opposite side from the thermal transfer surface 108) and therefore is offset from the thermal transfer surface 108 in a height direction (i.e., along the Z-axis) of the cooling block 100 that is normal to the thermal transfer surface 108. In other embodiments, the base 104 may not define a pocket 120 to receive the cover 106 (e.g., the cover 106 may be welded to the base 104 along a periphery thereof). In such embodiments, the upper surface 116 of the base 104 is not surrounded by the rim portion 117.

In this embodiment, the cover 106 is a plate member that is generally planar and shaped to be received within the pocket 120. Notably, the lower surface 114 of the cover 106 is a flat surface that closes off the fluid conduit 115 from its upper side. It is contemplated that, in other embodiments, the cover 106 could partly define the path of the fluid conduit 115 (e.g., the lower surface 114 of the cover 106 could define a recess that is complementary to the recess 132). As shown in FIG. 1, in this embodiment, an inlet connection 125 and an outlet connection 127 (e.g., pipes) are provided on the cover 106 and are in fluid communication with the inlet 110 and the outlet 112 of the fluid conduit 115 respectively. The inlet and outlet connections 125, 127 are connected to additional piping (not shown) to route cooling fluid to the cooling block 100 and discharge cooling fluid from the cooling block 100 respectively.

The fluid conduit 115 will now be described in greater detail with reference to FIG. 3. The fluid conduit 115 extends from the inlet 110 to the outlet 112 along the path defined, in this embodiment, by the recess 132 of the base 104. In this embodiment, the path described by the fluid conduit 115 from the inlet 110 to the outlet 112 is generally spiral. However, it is contemplated that the fluid conduit 115 may describe any other suitable path in other embodiments. For instance, the path described by the fluid conduit 115 from the inlet 110 to the outlet 112 could be a serpentine path (e.g., an S-shaped path), a rectilinear path, etc. Notably, the path described by the fluid conduit 115 could be designed in accordance with a particular configuration of the heat-generating electronic component 50, such as the placement of one or more dies 57 (FIGS. 2, 5) of the heat-generating electronic component 50).

As can be seen, in this embodiment, the fluid conduit 115 splits into a plurality of channels, namely first and second channels $122_1$, $122_2$, such that the cooling fluid flowing through the fluid conduit 115 is divided into the first and second channels $122_1$, $122_2$. That is, a first portion of the total flow rate of cooling fluid flows through the first channel $122_1$ and a second portion of the total flow rate of cooling fluid flows through the second channel $122_2$ in parallel with the first portion of the total flow rate. In this embodiment, the point at which the fluid conduit 115 splits into the first and second channels $122_1$, $122_2$ is the inlet 110. In other embodiments, the point at which the fluid conduit 115 splits into the first and second channels $122_1$, $122_2$ could be further downstream from the inlet 110. For example, the fluid conduit 115 could have a single unitary portion extending from the inlet 110 and through which the entire flow rate of cooling fluid flows upstream from the point at which the fluid conduit 115 splits into the first and second channels $122_1$, $122_2$. Furthermore, in this embodiment, the first and second channels $122_1$, $122_2$ merge at the outlet 112. In other embodiments, the point at which the first and second channels $122_1$, $122_2$ merge could be upstream from the outlet 112.

Each of the channels $122_1$, $122_2$ is defined in part between opposite internal sidewalls 140, 142 defining a width of the channel therebetween. In particular, the first channel $122_1$ has a width W1 measured between its internal sidewalls 140, 142, and the second channel $122_2$ has a width W2 measured between its internal sidewalls 140, 142. Each of the channels $122_1$, $122_2$ is also defined in part between a top wall 146 and a bottom wall 144 extending between the first and second internal sidewalls 140, 142 of the channel. The internal sidewalls 140, 142, and the bottom wall 144 and the top wall 146 of each channel $122_1$, $122_2$ extend along a length of that channel $122_1$, $122_2$ (i.e., from the inlet 110 to the outlet 112 in this example). The top wall 146 of each of the channels $122_1$, $122_2$ is formed by the cover 106 when the cover 106 is secured to the base 104. Notably, the top wall 146 is part of the lower surface 114 (FIG. 2) of the cover 106. As will be appreciated, the bottom wall 144 is closer to the thermal transfer surface 108 than the top wall 146 (i.e., a distance between the thermal transfer surface 108 and the bottom wall 144 defining any of the channel is less than the distance between the thermal transfer surface 108 and the top wall 146 defining that same channel). The first channel $122_1$ has a height H1 measured between bottom and top walls 144, 146 and the second channel $122_2$ has a height H2 measured between its bottom and top walls 144, 146.

It is to be understood that the width and height of each channel $122_1$, $122_2$ as defined herein refers to the cross-sectional width and height thereof (i.e., the width and height of a section of the channel taken along a plane that is normal to the internal sidewalls 140, 142 and the bottom and top walls 144, 146).

As best shown in FIG. 2, the first and second channels $122_1$, $122_2$ have different dimensional configurations. That is, the dimensions of the first and second channels $122_1$, $122_2$ are different from each other. More specifically, the height H1 of the first channel $122_1$ has a height value that is greater than that of the height H2 of the second channel $122_1$, while the width W2 of the second channel $122_2$ has a width value that is greater than that of the width W1 of the first channel $122_1$. In this embodiment, despite having different heights and widths, the first and second channels $122_1$, $122_2$ have a common cross-sectional area. That is, the product of the height H1 and width W1 of the first channel $122_1$ is equal to the product of the height H2 and width W2 of the second channel $122_2$. This may be helpful to minimize the amount of pressure loss in the fluid conduit 115 such that the first portion of the total flow rate of cooling fluid that flows through the first channel $122_1$ is approximately equal to the second portion of the total flow rate of cooling fluid that flows through the second channel $122_2$. As a result, the cooling provided by the first and second channels $122_1$, $122_2$ is generally uniform.

In some embodiments, the cross-sectional area of the first channel $122_1$ may be different from the cross-sectional area of the second channel $122_2$ while still achieving many of the benefits of this configuration of the cooling block 100.

In this embodiment, the height H1 of the first channel $122_1$ and the width W2 of the second channel $122_2$ are between 2 mm and 5 mm inclusively. More specifically, in this example, the height H1 of the first channel $122_1$ and the width W2 of the second channel $122_2$ are approximately 3 mm.

In this embodiment, the height H2 of the second channel $122_2$ and the width W1 of the first channel $122_1$ are between 1 mm and 3 mm inclusively. More specifically, in this example, the height H2 of the second channel $122_2$ and the width W1 of the first channel $122_1$ are approximately 1.5 mm.

This range of dimensions of the first and second channels $122_1$, $122_2$ results in relatively small channels which is desirable for cooling small heat-generating electronic components 50 (e.g., highly power dense electronic components), while not being so small that manufacturing of the cooling block 100 is rendered overly complex. For instance, with these dimensions, the channels $122_1$, $122_2$ can be formed by milling in a relatively straightforward manner, as will be described in greater detail below.

Figure 5:
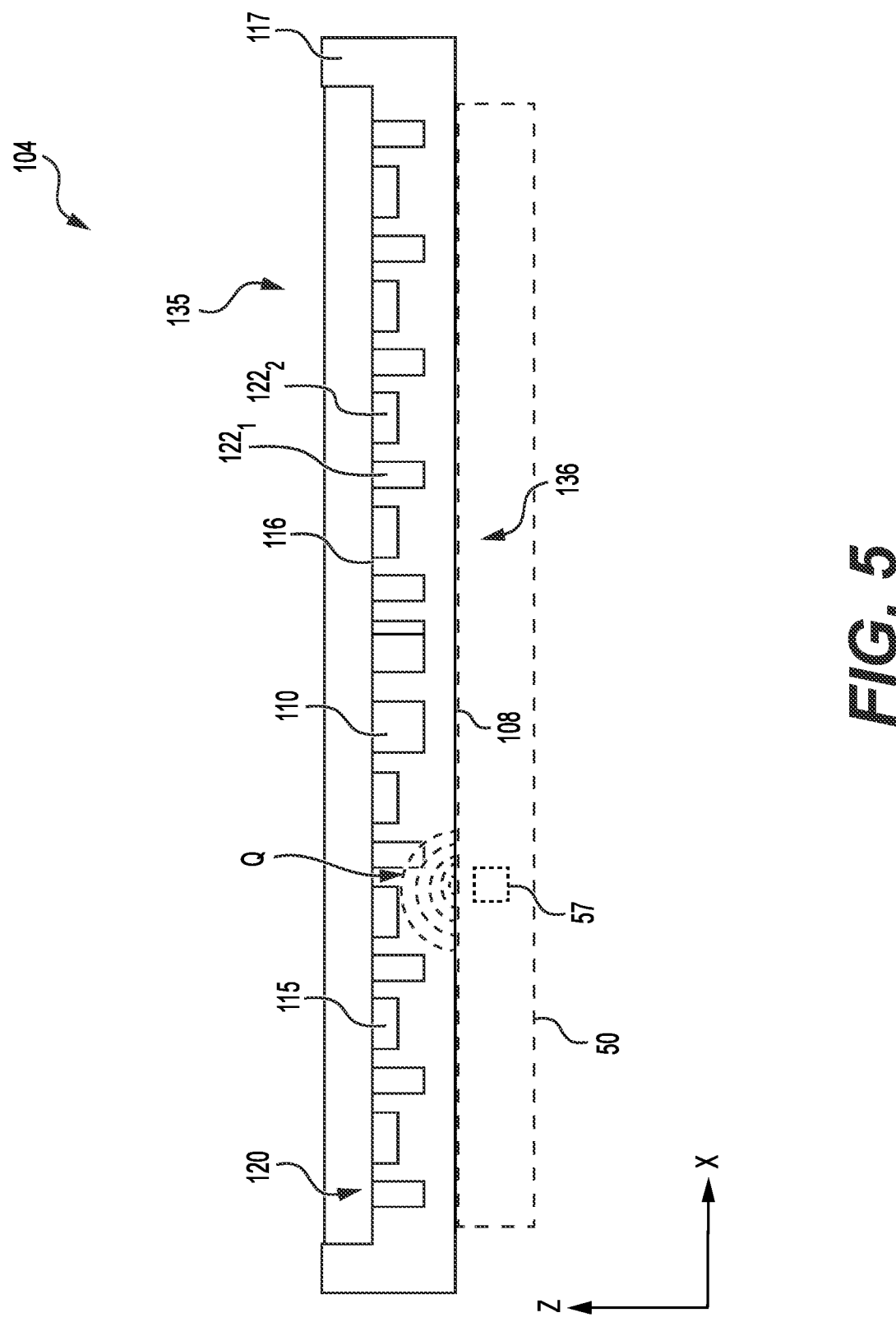
FIG. 5 is a cross-sectional view of the base of FIG. 4 taken along line 5-5 in FIG. 4.

As will be appreciated, in this embodiment, as a result of the heights H1, H2 being different from each other, the respective distances between the thermal transfer surface 108 and the channels $122_1$, $122_2$ in the height direction (i.e., in a direction normal to the thermal transfer surface 108) are different. In particular, in this embodiment, the thickness of the material of the base 104 between the thermal transfer surface 108 and any part of the first channel $122_1$ is less than the thickness of the material of the base 104 between the thermal transfer surface 108 and any part of the second channel $122_2$. The thickness of the material of the base 104 is measured in a height direction of the cooling block 100 (i.e., normal to the thermal transfer surface 108). This variable thickness between the thermal transfer surface 108 and the first and second channels $122_1$, $122_2$ can result in a more uniform heat absorption pattern and thus greater cooling efficiency from the cooling block 100. Notably, as shown in FIG. 5, the heat Q emitted by a punctual heat source, such as a die 57, of the heat-generating electronic component 50 is conducted through the material of the base 104 in a generally hemispheric pattern. As such, if the path of the fluid conduit 115 is designed so that the punctual heat source is aligned with part of the second channel $122_2$, the heat Q will be conducted more evenly to walls of both channels $122_1$, $122_2$, thus enhancing the convection between the channels $122_1$, $122_2$ and their respective walls.

The manner in which the recess 132 of the base 104, and thus the fluid conduit 115, is formed in order to manufacture the cooling block 100 will now be described in greater detail. In this embodiment, the unfinished base 104 is installed on a mill. With an appropriate milling cutter installed on the mill, the first channel $122_1$ is then milled on the upper surface 116 of the base 104. More specifically, in this embodiment, milling the first channel $122_1$ involves performing a first cutting operation and, subsequently, a second cutting operation to remove material from the base 104. In particular, with reference to FIG. 4, in the first cutting operation, the milling cutter removes material from the base 104 while following a path P1 to remove material along the path P1. The path P1 has been partially illustrated in FIG. 4 for clarity; the reader should understand that the path P1 extends along the entire length of the channel $122_1$.

In this first cutting operation, the milling cutter is set at a first depth from the upper surface 116 of the base 104. Notably, the first depth is equal to or less than a diameter of the milling cutter (e.g., 1.5 mm). In this example, the first depth corresponds to the diameter of the milling cutter. In the second cutting operation, which is performed after the first cutting operation, the milling cutter removes material from the base 104 along the same path P1 but with the milling cutter being set at a second depth from the upper surface 116 greater than the first depth. For instance, in this example, the second depth is two times greater than the first depth (e.g., 3 mm). The first channel $122_1$ is thusly formed by performing the two cutting operations.

Figure 4:
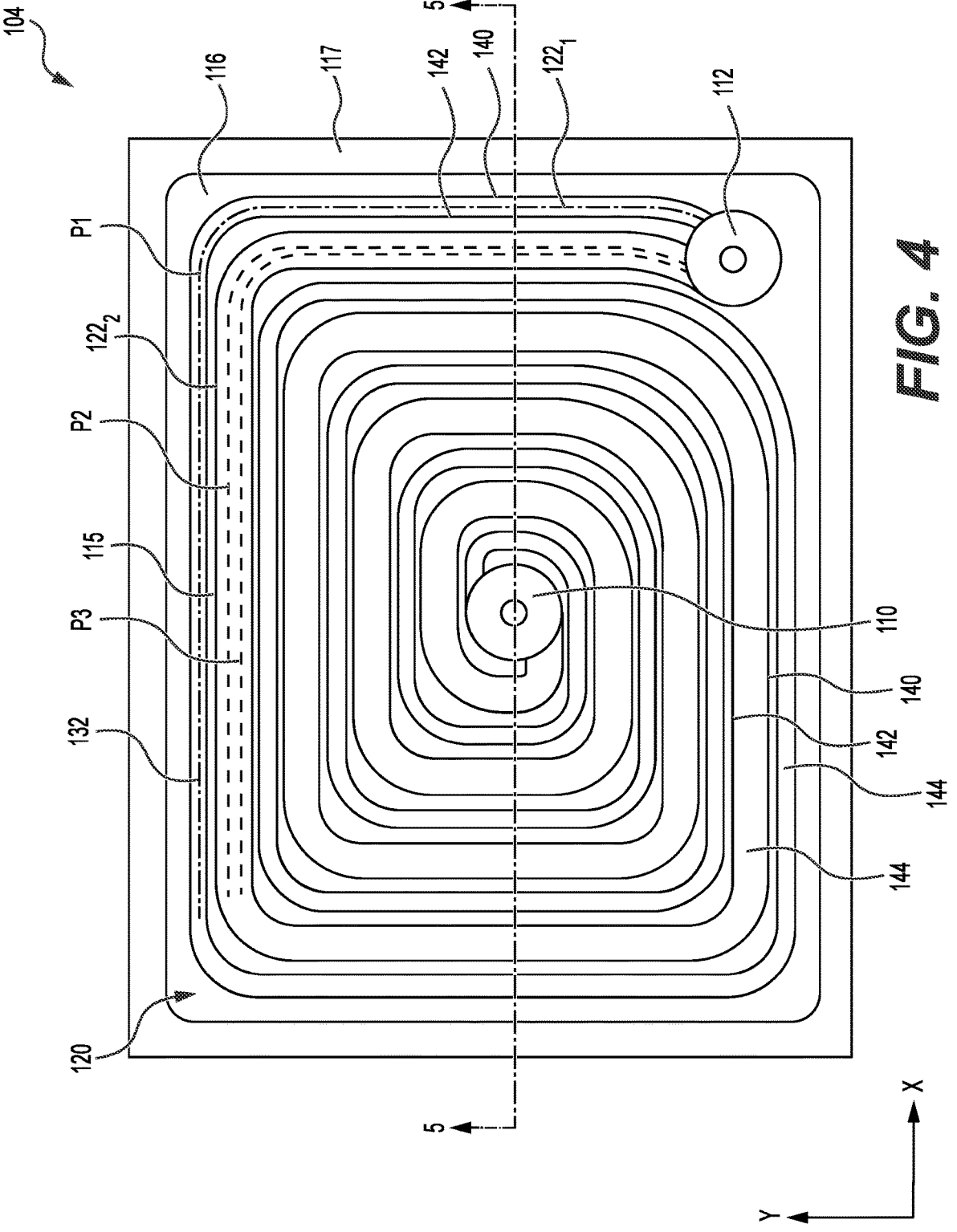
FIG. 4 is a top plan view of the base of the cooling block of FIG. 3.

The second channel $122_2$ is then milled on the upper surface 116. The order of forming the channels $122_1$, $122_2$ may be reversed. In this embodiment, given their dimensions, the same milling cutter that is used to mill the first channel $122_1$ is used to mill the second channel $122_2$ and therefore a tool change between the milling of the channels $122_1$, $122_2$ is not necessary. It is contemplated that, in other embodiments, a tool change may be effected after milling the first channel $122i$. Milling the second channel $122_2$ involves performing a third cutting operation and, subsequently, a fourth cutting operation to remove material from the base 104. It is to be understood that the numbering of the cutting operations is done solely for clarity and not to set the order of the cutting operations unless explicitly described otherwise. With reference to FIG. 4, in the third cutting operation, the milling cutter removes material from the base 104 while following a path P2 to remove material along the path P2. The path P2 has been partially illustrated in FIG. 4 for clarity; the reader should understand that the path P2 extends along the entire length of the channel $122_2$. In the third cutting operation, the milling cutter is set at a depth from the upper surface 116 that is equal to or less than the diameter of the milling cutter. In the fourth cutting operation, the milling cutter removes material from the base 104 while following a path P3 to remove material along the path P3. The path P3 has been partially illustrated in FIG. 4 for clarity; the reader should understand that the path P3 extends along the entire length of the channel $122_2$. In the fourth cutting operation, the milling cutter is set at the same depth from the upper surface 116 as in the third cutting operation. The path P3 is adjacent to the path P2 such that, by cutting along both paths P2, P3, the milling cutter forms the second channel $122_2$. In this example, the path P2 is parallel to the path P3. It is contemplated that the paths P2, P3 may not be parallel in other embodiments.

Figure 6:
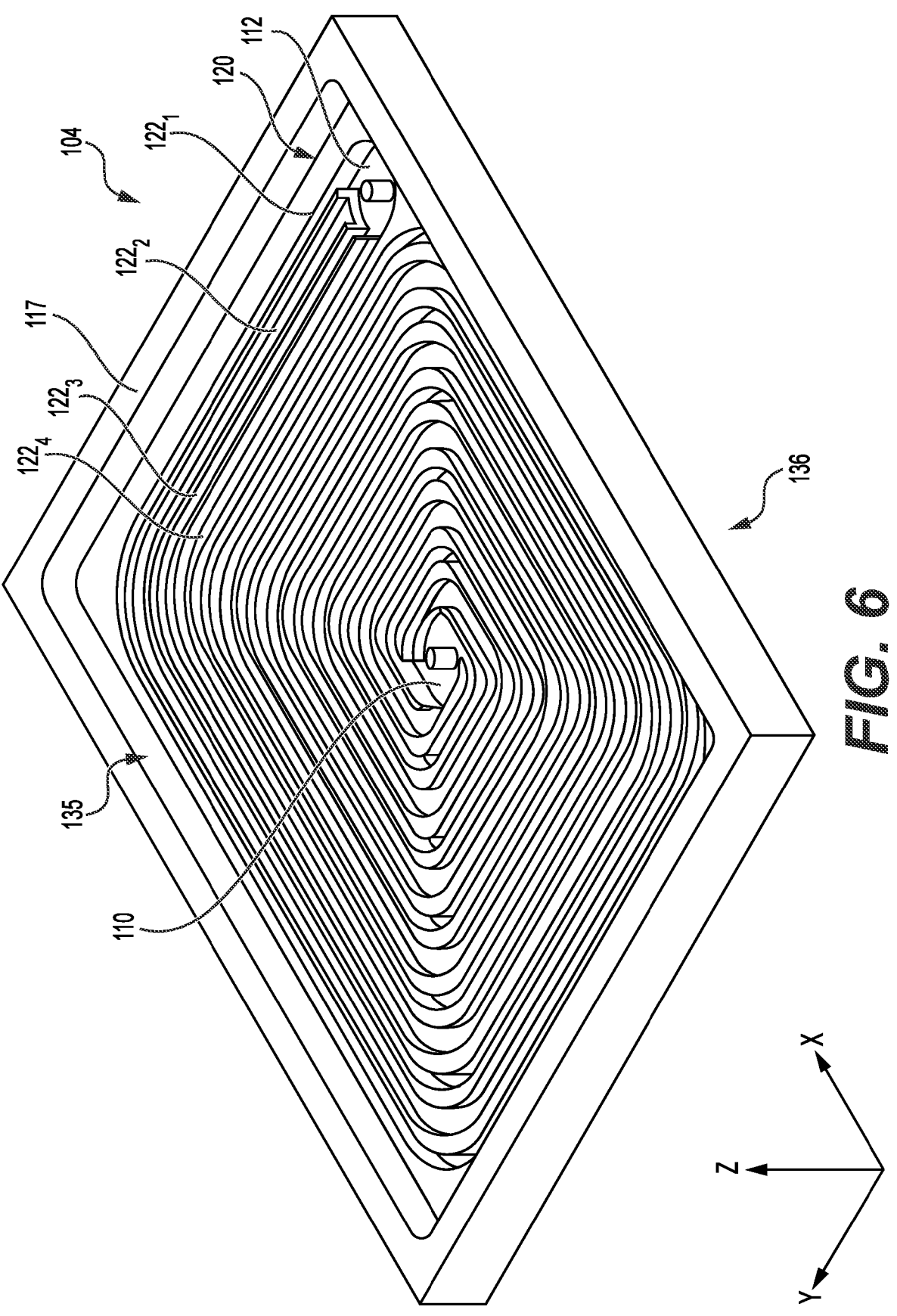
FIG. 6 is a perspective view, taken from a top, front, left side, of a base of the cooling block according to another embodiment.

The fluid conduit 115 could have more channels in other embodiments. For instance, with reference to FIG. 6, in some embodiments, the fluid conduit 115 has, in addition to the first and second channels $122_1$, $122_2$, a third channel $122_3$ and a fourth channel $122_4$ that also extend from the inlet 110 to the outlet 112 in parallel to the first and second channels $122_1$, $122_2$. In other words, in this embodiment, the total flow rate of cooling fluid is divided into four separate portions that flow through respective ones of the channels $122_1$, $122_2$, $122_3$, $122_4$. In this embodiment, the four channels $122_1$, $122_2$, $122_3$, $122_4$ merge again at the outlet 112. In this embodiment, the first and third channels $122_1$, $122_3$ have the same dimensional configuration as each other, and the second and fourth channels $122_2$, $122_4$ have the same dimensional configuration as each other. In particular, the third channel $122_3$ has the same height H1 and width W1 as the first channel $122_1$, while the fourth channel $122_4$ has the same height H2 and width W2 as the second channel $122_2$.

A different number of channels may be provided in other embodiments (e.g., three, five or more).

Furthermore, in other embodiments, the channels may have different shapes. For example, in some cases, the internal sidewalls 140, 142 defining respective ones of the channels $122_1$, $122_2$, $122_3$, $122_4$ may have a sinusoidal shape such that the channels $122_1$, $122_2$, $122_3$, $122_4$ have a wavy configuration.

Figure 7:
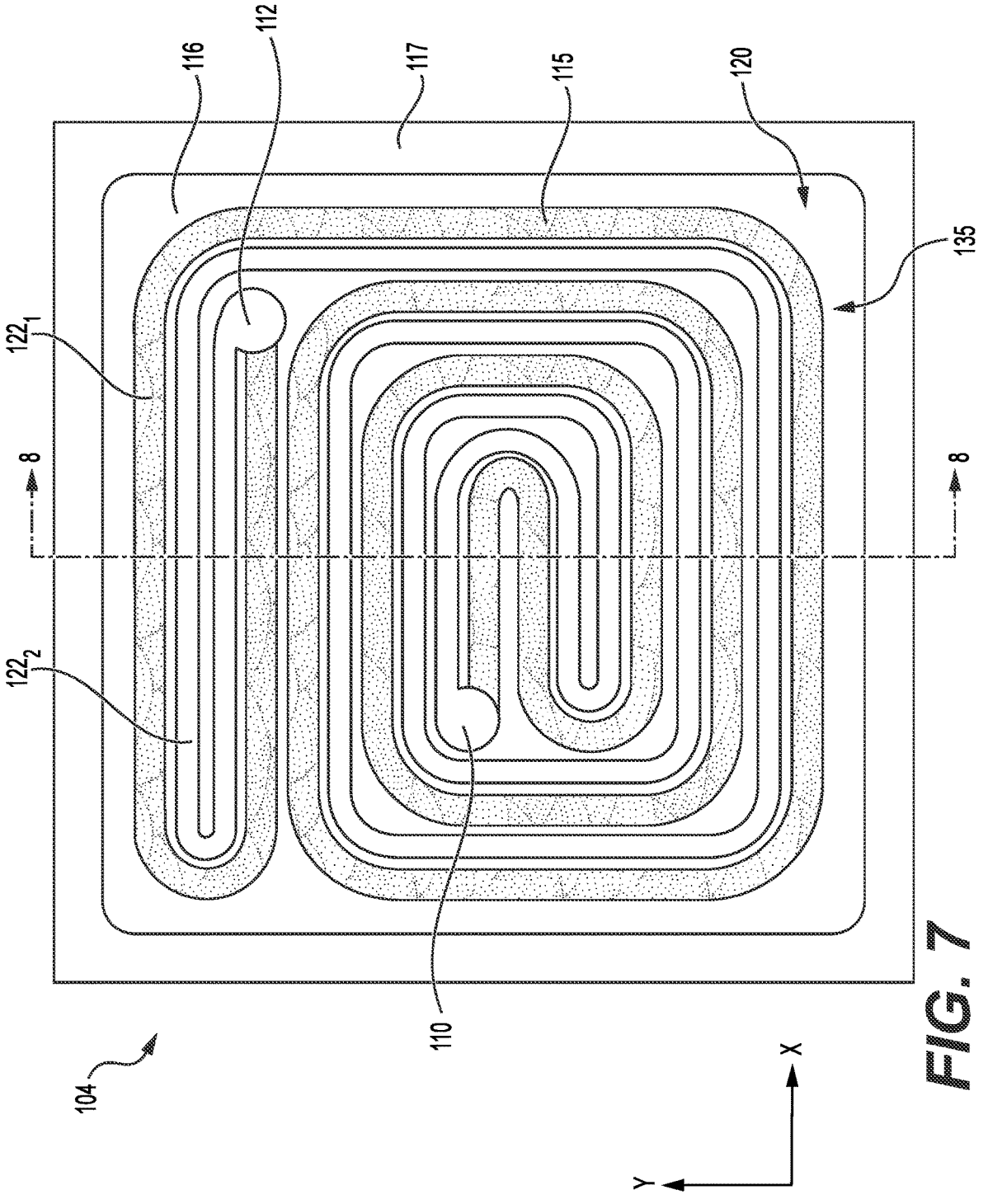
FIG. 7 is a top plan view of a base of the cooling block according to another embodiment.
Figure 8:
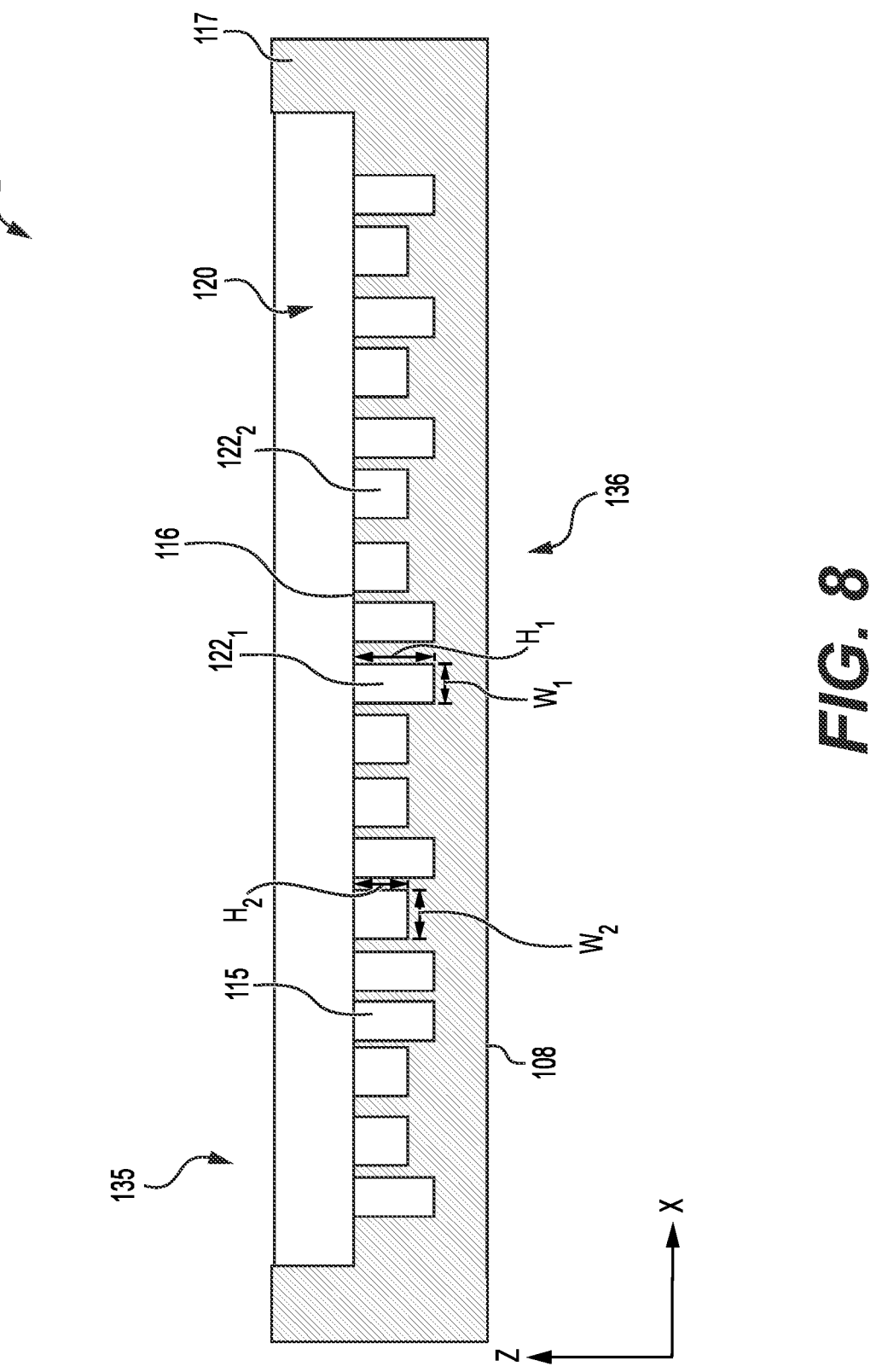
FIG. 8 is a cross-sectional view of the base of FIG. 7 taken along line 8-8 in FIG. 7.

As mentioned above, the path of the fluid conduit 115 may be completely different in other embodiments. Notably, with reference to FIGS. 7 and 8, as can be seen, in an alternative embodiment, the path of the fluid conduit 115 is not spiral, and rather describes a path that is particular for the heat-generating electronic component 50 that it is intended to cool. Moreover, in this alternative embodiment, the cross-sectional areas of the first and second channels $122_1$, $122_2$ are not the same. For instance, in this example, the width W1 of the first channel $122_1$ is approximately 1.5 mm, and its height is H1 is approximately 3 mm, while the width W2 of the second channel $122_2$ is approximately 2 mm and its height H2 is approximately 2 mm. Consequently, the cross-sectional area of the first channel $122_1$ is greater than the cross-sectional area of the second channel $122_2$. As such, a smaller flow rate of cooling fluid may flow through the second channel $122_2$ than through the first channel $122_1$.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A cooling block for cooling a heat-generating electronic component, comprising:

a body having a thermal transfer surface on a lower side thereof configured to be in thermal contact with the heat-generating electronic component, the body defining a fluid conduit for circulating a cooling fluid therethrough, the fluid conduit having an inlet and an outlet for receiving and discharging the cooling fluid respectively;

the fluid conduit having a plurality of channels extending from a first point to a second point along the fluid conduit such that, in use, the cooling fluid flows in parallel along the channels from the first point to the second point, each channel of the plurality of channels being defined between:

first and second internal sidewalls defining a width of the channel therebetween; and top and bottom walls extending between the first and second internal sidewalls, a height of the channel being defined between the top and bottom walls, the bottom wall being closer to the thermal transfer surface in a height direction of the cooling block than the top wall, wherein:

each channel of the plurality of channels is dimensioned to have either:

a first dimensional configuration whereby the height of the channel has a first height value and the width of the channel has a first width value; or a second dimensional configuration whereby the height of the channel has a second height value and the width of the channel has a second width value, the first height value being greater than the second height value, and the second width value being greater than the first width value;

wherein the plurality of channels includes at least one first channel having the first dimensional configuration and at least one second channel having the second dimensional configuration; and a thickness of a material of the body between the thermal transfer surface and the bottom wall of the at least one first channel is less than a thickness of the material of the body between the thermal transfer surface and the bottom wall of the at least one second channel.

2. The cooling block of claim 1, wherein each channel of the plurality of channels has a common cross-sectional area that is a product of the height and the width thereof.

3. The cooling block of claim 2, wherein:

the first height value is equal to the second width value; and the second height value is equal to the first width value.

4. The cooling block of claim 3, wherein:

the first height value and the second width value are between 2 and 5 mm inclusively; and the second height value and the first width value are between 1 and 3 mm inclusively.

5. The cooling block of claim 3, wherein the first height value and the second width value are approximately 3 mm.

6. The cooling block of claim 3, wherein the second height value and the first width value are approximately 1.5 mm.

7. The cooling block of claim 1, wherein the at least one first channel includes two first channels.

8. The cooling block of claim 1, wherein the at least one second channel includes two second channels.

9. The cooling block of claim 1, wherein the first point corresponds to the inlet of the fluid conduit and the second point corresponds to the outlet of the fluid conduit.

10. The cooling block of claim 1, wherein:

the body of the cooling block comprises a base and a cover connected to the base, the base comprising the thermal transfer surface; and a path of the fluid conduit is defined by the base of the cooling block.

11. The cooling block of claim 10, wherein:

the cover is a planar plate member; and the top wall defining each channel of the plurality of channels is defined by a lower surface of the cover.

12. The cooling block of claim 1, wherein a path described by the fluid conduit is generally spiral.

* * * * *